United States Patent

[11] 3,600,645

[72] Inventor Herbert S. Berman
Pittsburgh, Pa.
[21] Appl. No. 832,117
[22] Filed June 11, 1969
[45] Patented Aug. 17, 1971
[73] Assignee Westinghouse Electric Corporation
Pittsburgh, Pa.

[54] SILICON CARBIDE SEMICONDUCTOR DEVICE
5 Claims, 5 Drawing Figs.

[52] U.S. Cl. ........ 317/234 R, 317/235 R, 317/234 L, 317/234 M, 317/235 AP, 29/589
[51] Int. Cl. ........ H01l 3/00
[50] Field of Search ........ 317/48.3, 5.3

[56] References Cited

UNITED STATES PATENTS

| | | | |
|---|---|---|---|
| 3,290,570 | 12/1966 | Cunningham et al. ........ | 317/240 |
| 3,030,704 | 4/1962 | Hall ........ | 29/472.9 |
| 3,047,439 | 7/1962 | Daal et al. ........ | 148/33 |
| 3,377,210 | 4/1968 | Someville et al. ........ | 148/1.5 |
| 3,463,976 | 8/1969 | Steinmetz et al. ........ | 317/235 |
| 3,483,096 | 12/1969 | Gri et al. ........ | 204/15 |
| 3,501,681 | 3/1970 | Weir ........ | 317/234 |

*Primary Examiner*—John W. Huckert
*Assistant Examiner*—B. Estrin
*Attorneys*—F. Shapoe and C. L. Menzemer

ABSTRACT: This disclosure relates to a silicon carbide device in which electrodes affixed to a wafer of silicon carbide are gold plated. As a result of the gold plating of the electrodes, the device need not be hermetically sealed. In addition, the gold plating operation provides a method of testing the device for leakage current.

SILICON CARBIDE SEMICONDUCTOR DEVICE

BACKGROUND OF THE INVENTION

1. Field of the Invention

This invention is in the field of semiconductor devices and relates especially to a silicon carbide device, and to its method of manufacture and testing.

2. Description of the Prior Art

A tungsten-silicon carbide-tungsten sandwich is the basic unit in a silicon carbide diode or ultraviolet radiation detector. The basic unit must be encapsulated in a hermetically sealed package to protect the tungsten from oxidation.

The tungsten, in the past could not be plated or otherwise protected before assembly because of the likelihood of damage to the silicon carbide.

In addition, in the past, if after attaching the tungsten contacts, the silicon carbide body was found to have leakage current paths either through it or along its perimeter, the only course of action was to sandblast the sides of the body until either the leakage current paths disappeared or the body was destroyed.

An object of this invention is to provide a silicon carbide semiconductor device that is free of all hermetic packaging.

Another object of this invention is to provide a process for protecting tungsten electrodes affixed to a body of silicon carbide from oxidation.

Still another object is to provide a method of testing a silicon carbide semiconductor device for leakage currents.

Other objects will, in part, be obvious and will, in part, appear hereinafter.

SUMMARY OF THE INVENTION

In accordance with the present invention and attainment of the foregoing objects there is provided a silicon carbide semiconductor device comprising a body of silicon carbide, said body having opposed substantially parallel major surfaces, a first region of a first type of semiconductivity a second region of a second type of semiconductivity, a PN junction between said first and said second regions, said first region extending from said PN junction to one of said major surfaces, said second region extending from said PN junction to the other major surfaces, a tungsten contact affixed to each of the major surfaces, each of said tungsten contacts having a surface area larger than the area of the major surface to which it is affixed, and a layer of gold completely covering each of the tungsten contacts.

In addition, after the tungsten contacts are affixed to each of the opposed major surfaces of the silicon carbide body, the assembly, comprising the body of silicon carbide and tungsten contacts is disposed in a gold plating bath and the tungsten contacts are plated with gold. If any gold plates onto the silicon carbide during the plating operation it is indicative of a leakage current path. Such paths are then removed by sandblasting.

DESCRIPTION OF THE DRAWINGS

For a better understanding of the nature and objects of the invention, reference should be had to the following detailed description and drawings in which.

DESCRIPTION OF THE PREFERRED EMBODIMENT

Figure 1:
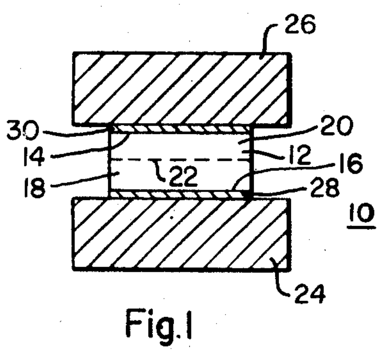
FIG. 1 is a side view, partially i5 section, of a silicon carbide device being processed in accordance with the teachings of this invention.

With reference to FIG. 1, there is shown a silicon carbide semiconductor diode device 10.

The device 10 is comprised of a body 12 of silicon carbide. The body 12 may have been prepared by any of the methods known to those skilled in the art, as for example, by either sublimation or isoepitaxial techniques.

The body 12 has a top surface 14 and a bottom surface 16. For the purpose of this invention it is irrelevant which surface is the carbon surface and which is the silicon surface. The thickness of the body 12 is not critical but usually falls within the range of 10 to 20 mils.

The body 12 has an N-type region 18, and a P-type region 20 with a PN junction 22 therebetween.

The N-type region 18 is doped with a suitable N-type dopant, as for example nitrogen to a concentration of from $10^{16}$ to $10^{19}$ atoms of nitrogen per cubic centimeter of silicon carbide. The P-type region 20 is doped with a suitable P-type dopant, as for example aluminum or boron to a concentration of $10^{17}$ to $10^{18}$ atoms of dopant per cubic centimeter of silicon carbide. For the most satisfactory results, the doping concentration of P-type region 20 should exceed the doping concentration of the N-type region 18 by at least an order of magnitude.

A first electrical contact 24 is affixed to the bottom surface 16 of the body 12 and a second electrical contact 26 is affixed to the top surface 14 of the body 12. The electrical contacts 24 and 26 are of tungsten. The use of a contact which is larger than the silicon carbide body protects the body from damage and improves heat dissipation.

The electrical contacts 24 and 26 are joined to the respective surfaces 16 and 14 by solder layers 28 and 30 respectively. The solder layers 28 and 30 consist of gold and one element selected from the group consisting of tantalum and nickel. Particularly satisfactory solders are ones consisting of, all parts by weight, 94 percent gold and 6 percent tantalum; a gold nickel eutectic consisting of approximately 60 percent gold and 40 percent nickel.

It will be understood that while the device of FIG. 1 is shown comprising two regions of opposite type semiconductivity with one PN junction therebetween, the teachings of this invention are equally applicable to devices containing more than two regions, as for example four region devices with PN junctions between adjacent regions of opposite type semiconductivity.

Figure 2:
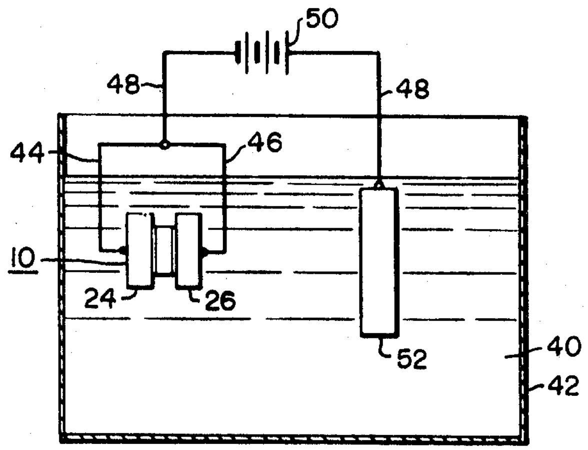
FIG. 2 is a side view of the device of FIG. 1 being processed in accordance with the teachings of this invention.

With reference to FIG. 2, the device 10 is disposed within gold plating solution 40 contained within a tank 42.

The gold plating solution 40 is preferably of the acid bath type set forth in U.S. Pat. No. 3,104,212 and preferably does not contain any brightener components.

The device 10 has an electrical conductor 44 and 46 connected to electrical contacts 24 and 26 respectively which in turn are both connected through an electrical conductor 48 to a battery 50, or other suitable direct current power source, and a platinum electrode, anode, 52.

The solution 40 is heated to a temperature within the range of from 40° C. to 50° C. and an electrical current having a density of about 2 amperes per square foot is caused to flow from the anode 50 to the device 10, whereby the gold in the solution 40 is plated only onto the electrical contacts 24 and 26 of the device 10. The plating operation is carried out for approximately 6 minutes.

Figure 3:
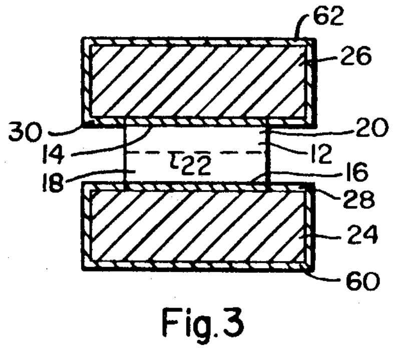
FIGS. 3 and 4 are side views of the silicon carbide device of this invention.

With reference to FIG. 3, there is shown the device of FIG. 1 after the gold plating operation, shown in FIG. 2, has been completed. There is a gold layer 60 disposed completely about and completely covering electrical contact 24 and a gold layer 62 disposed completely about and completely covering electrical contact 26. The thickness of the gold layers 60 and 62 may vary from 1 to 10 millionth of an inch. The thickness is of course dependent on the length of time the plating operation is carried out.

There is no gold plated on the silicon carbide body 12 due to the arrangement of electrical conductors 44, 46 and 48 and the PN junction 22 which blocks any current flow through the body 12 during plating.

Device 110 of FIG. 3 is suitable for use as a semiconductor device without any further encapsulation. The silicon carbide itself is able to withstand high temperatures and a corrosive ambient. The gold plated tungsten contacts too can withstand high temperatures and a corrosive atmosphere.

Figure 4:
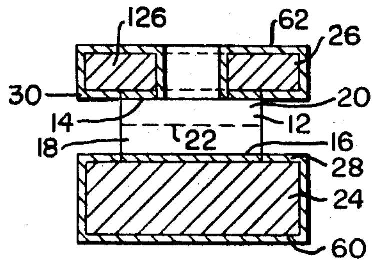

While the device of FIG. 3 has been shown as having two solid electrical contacts 24 and 26 affixed to opposed major faces of the body 12 it should be understood that at least one of the contacts may be annular in configuration. Such a structure is shown in FIG. 4 wherein electrical contact 126 is annular.

The device 110 of FIG. 3 was operated as shown, without any additional encapsulation for 20 hours at 600° C. in air, with no degradation of electrical properties. The device 10 of FIG. 1 lasted less than 5 hours when tested under the same conditions.

The process of this invention is also useful in detecting leakage current paths in silicon carbide semiconductor devices.

Figure 5:
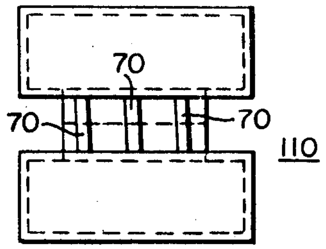
FIG. 5 is a side view of a silicon carbide device having an electrical leakage current defect that can be corrected in accordance with the teachings of this invention.

With reference to FIG. 5, if after removing the device 110 from the gold plating bath 40, any gold deposits 70 on the surface of the silicon carbide body 12 indicate a leakage current path. Such leakage current paths render the device unsuitable for use.

The device can be made suitable for use by removing the leakage current paths by sandblasting. After sandblasting the device can be returned to the bath and further plating carried out to ensure that the leakage current paths have been totally removed.

It can be seen therefore that the process of this invention also provides a method of testing prepared silicon carbide devices for leakage current paths.

I claim as my invention:

1. A silicon carbide semiconductor device consisting of a body of silicon carbide, said body having opposed major surfaces, at least a first region of a first type of semiconductivity and at least a second region having an opposite type of semiconductivity, at least one PN junction between said first and second region, metal electric contacts affixed to each of the opposed major surfaces of the body of silicon carbide by means of an alloy solder layer composed of either 94 percent gold and 6 percent tantalum or 60 percent gold and 40 percent nickel, and a layer of gold electroplated to each of said metal electrical contacts after the contacts are affixed to the silicon carbide body so as to completely cover all of the surface area of the metal contacts which is not in direct contact with the alloy solder layer, whereby, said device is suitable for use without being hermetically encapsulated.

2. The device of claim 1 in which the metal electrical contacts are of tungsten.

3. The device of claim 2 in which there are two regions of opposite type semiconductivity, a PN junction therebetween and one region extends from the PN junction to one major surface and the other region extends from the PN junction to the other major surface.

4. The device of claim 3 in which one of the tungsten contacts is annular in shape and covers less than all of the surface of the silicon carbide body to which it is affixed.

5. The device of claim 3 in which both tungsten contacts completely cover all of the surface of the silicon carbide body to which they are affixed.